US008521256B2

(12) United States Patent
Ogino

(10) Patent No.: US 8,521,256 B2
(45) Date of Patent: Aug. 27, 2013

(54) RETROSPECTIVE MOTION COMPENSATION IN MAGNETIC RESONANCE IMAGING

(75) Inventor: Tetsuo Ogino, Minato-Ku (JP)

(73) Assignee: Koninklijke Philips N.V., Eindhoven (NL)

( * ) Notice: Subject to any disclaimer, the term of this patent is extended or adjusted under 35 U.S.C. 154(b) by 257 days.

(21) Appl. No.: 12/937,280

(22) PCT Filed: Apr. 14, 2009

(86) PCT No.: PCT/IB2009/051540
§ 371 (c)(1),
(2), (4) Date: Oct. 11, 2010

(87) PCT Pub. No.: WO2009/128018
PCT Pub. Date: Oct. 22, 2009

(65) Prior Publication Data
US 2011/0034799 A1 Feb. 10, 2011

(30) Foreign Application Priority Data
Apr. 18, 2008 (EP) .................................... 08154816

(51) Int. Cl.
*A61B 5/05* (2006.01)
(52) U.S. Cl.
USPC .......................................... 600/410; 600/407
(58) Field of Classification Search
USPC ......................................... 600/407, 410–423
See application file for complete search history.

(56) References Cited

U.S. PATENT DOCUMENTS

| 5,613,492 | A  | 3/1997  | Feinberg       |
|-----------|----|---------|----------------|
| 2003/0117136 | A1 | 6/2003  | Wang et al.    |
| 2004/0199064 | A1 | 10/2004 | Van Liere et al. |
| 2005/0047672 | A1 | 3/2005  | Ben-Ezra et al. |
| 2007/0001674 | A1 | 1/2007  | Purdy          |
| 2007/0038071 | A1 | 2/2007  | Nauerth        |
| 2007/0088212 | A1 | 4/2007  | Takei et al.   |

FOREIGN PATENT DOCUMENTS

EP    0952547 A2    10/1999

OTHER PUBLICATIONS

Ehman, R.: Adaptive Technique for High-Definition MR Imaging of Moving Structures; Magnetic Resonance Imaging; RSNA 1989, pp. 255-263.
Bernstein et al: "Handbook of MRI Pulse Sequences"; Elsevier Academic Press, 2004, Chapter 12: "Physiologic Gating, Triggering, and Monitoring"; pp. 454-473.

*Primary Examiner* — James Kish

(57) ABSTRACT

A magnetic resonance imaging apparatus comprises a data acquisition system with motion compensation means for acquiring an image data set in respect of a moving object within an imaging region, the image data set comprising a plurality of acquisitions each in respect of one or more slice planes. Further there are means for averaging, on a slice-by-slice basis, said plurality of acquisitions to generate a single, average image set of said moving object. Also means are provided for calculating the actual scan location of all of said slice planes from all of said acquisitions, means for averaging a selected set of slice planes to generate a single, average image set of a static object within said imaging region. This averaging results in a high image quality in respect of the moving object (12) because for the static object, slice locations change for each acquisition.

5 Claims, 3 Drawing Sheets

RETROSPECTIVE MOTION COMPENSATION IN MAGNETIC RESONANCE IMAGING

FIELD OF THE INVENTION

This invention relates generally to retrospective motion compensation in magnetic resonance imaging (MRI), and more particularly to improved retrospective motion compensation in MRI to provide clearer images of both moving and static objects.

BACKGROUND OF THE INVENTION

In the case of a typical MR-imaging method, the object area which is to be examined, i.e. the "sample", is disposed in a stationary magnetic field $B_0$ and is subjected to a sequence of at least one electromagnetic high-frequency pulse (HF-pulse) of a selected frequency and to subsequent pulses of magnetic field gradients in various spatial directions, such that the HF-excitations cause echoes to occur which are detected as the MR-signal and provide information relating to the properties of the sample.

MRI tends to be the method of choice for noninvasive diagnosis of soft tissue disease in humans and has wide application in the medical field. Fast gradient technology has made high-resolution 3D imaging possible. However, high resolution MRI is primarily impeded by physiological movement, such as respiration or gross patient movement.

Diffusion weighted MR-Imaging has become more significant in recent years. By specifically selecting the type of MR-sequence and the amplitude and time relations of HF- and gradient pulses within the sequence, it is possible to ensure that the strength of the generated MR-signals or echoes depend considerably upon respectively determined, selected features of the sample. As a consequence, it is possible to generate an image, of which the contrast is "weighted" by the relevant feature.

With abdominal MR-imaging, images are affected by respiratory motion. Some MRI techniques, such as diffusion weighted MR-imaging, have a very low signal to noise ratio (SNR) on a single signal measurement. As a result, multiple measurements are usually performed in respect of a single slice location, so as to generate low SNR measurements, and these measurements are then averaged to create a single high SNR image. However, this type of averaging operation gives rise to blurring on moving objects because each measurement is performed at different timings of respiratory motion (i.e. scan location is shifted for each single measurement), if no synchronization method is used.

Respiratory triggering is one such synchronization method for ensuring that each measurement is performed on the same timing of the respiratory motion. As a result, every measurement is performed when the moving object is in the same position and this can avoid blurring due to motion. However, this technique has two problems associated therewith. One is that it restricts the timing of image acquisition in that there is a wait time required before and after each measurement is performed to wait for the moving object to return to exactly the same location during the motion cycle. This can lengthen total scan time by two or three times. Another problem is scan failure caused by a change in respiratory activity of the patient. A patient having a MRI scan can fall asleep during examination. This makes their breath very shallow such that the MR scanner continually fails to catch the trigger from the signal of a respiratory motion detecting device.

Navigator echo is another motion compensation technique, which detects motion prior to data acquisition and modifies data acquisition accordingly. Navigator techniques use image space navigator echoes for detecting motion during image data acquisition. Physiological motion causes global displacement in the navigator echo and results in a shift of the image space navigator echo compared to an image space reference navigator echo. The accuracy in extracting motion information from navigator echoes is crucial to the effectiveness of the navigator technique, and one such technique is described in US Patent Application Publication No. US2003/0117136A1. Effectively, in all navigator echo techniques, displacement of the moving object is measured prior to an imaging scan for each measurement and the imaging location is shifted based on the measured displacement. As a result, the same location of the object is imaged during multiple measurements and this avoids blurring due to motion. In contrast to the respiratory triggering technique described above, the navigator echo technique does not require a wait time to synchronize the imaging timing to respiratory motion. Therefore, the total scan time tends to be much shorter than for the respiratory triggering method.

However, one problem with the navigator echo technique arises when the imaging region contains both static and moving objects (for example, the liver and the spine). If the navigator echo method is applied an image focused on the moving object, the static object will be blurred. On the other hand, for an examination such as tumor screening, both moving organs and static objects should be of similar image quality. In that case, an MR user has to perform two scans, one with and one without navigator echo, which of course extends overall scan time.

SUMMARY OF THE INVENTION

It is an object of the present invention, therefore, to at least alleviate the problems noted above, and provide an improved system and method for retrospective motion compensation in magnetic resonance imaging, whereby clear images of both static and moving objects in the imaging region can be generated.

In accordance with the present invention, there is provided a magnetic resonance imaging apparatus comprising a magnetic resonance scanner and a data acquisition system including motion compensation means for acquiring an image data set in respect of a moving object within an imaging region, said image data set comprising a plurality of acquisitions each in respect of one or more slice planes, the apparatus further comprising means for averaging, on a slice-by-slice basis, said plurality of acquisitions to generate a single, average image set of said moving object, means for calculating the actual scan location of all of said slice planes from all of said acquisitions, means for averaging a selected set of slice planes to generate a single, average image set of a static object within said imaging region. The invention achieves to improve the image quality in that motion artifacts are reduced. Notably, good image quality of both moving as well as stationary structures is obtained.

According to a further aspect of the invention said motion compensation means comprises navigator echo means.

The invention further relates to a computer program. The invention also relates to a magnetic resonance imaging method. The computer program can be provided on a carrier like a CD-rom or USB stick or from a datanetwork such as the internet. When the computer program is installed in or loaded into the computer or processor of the magnetic resonance imaging apparatus then the magnetic resonance imaging apparatus is enabled to perform the invention.

These and other aspects of the present invention will be apparent from, and elucidated with reference to the embodiments described herein.

BRIEF DESCRIPTION OF THE DRAWINGS

Embodiments of the present invention will now be described by way of examples only and with reference to the accompanying drawings, in which.

DETAILED DESCRIPTION OF THE EMBODIMENTS

Figure 1:
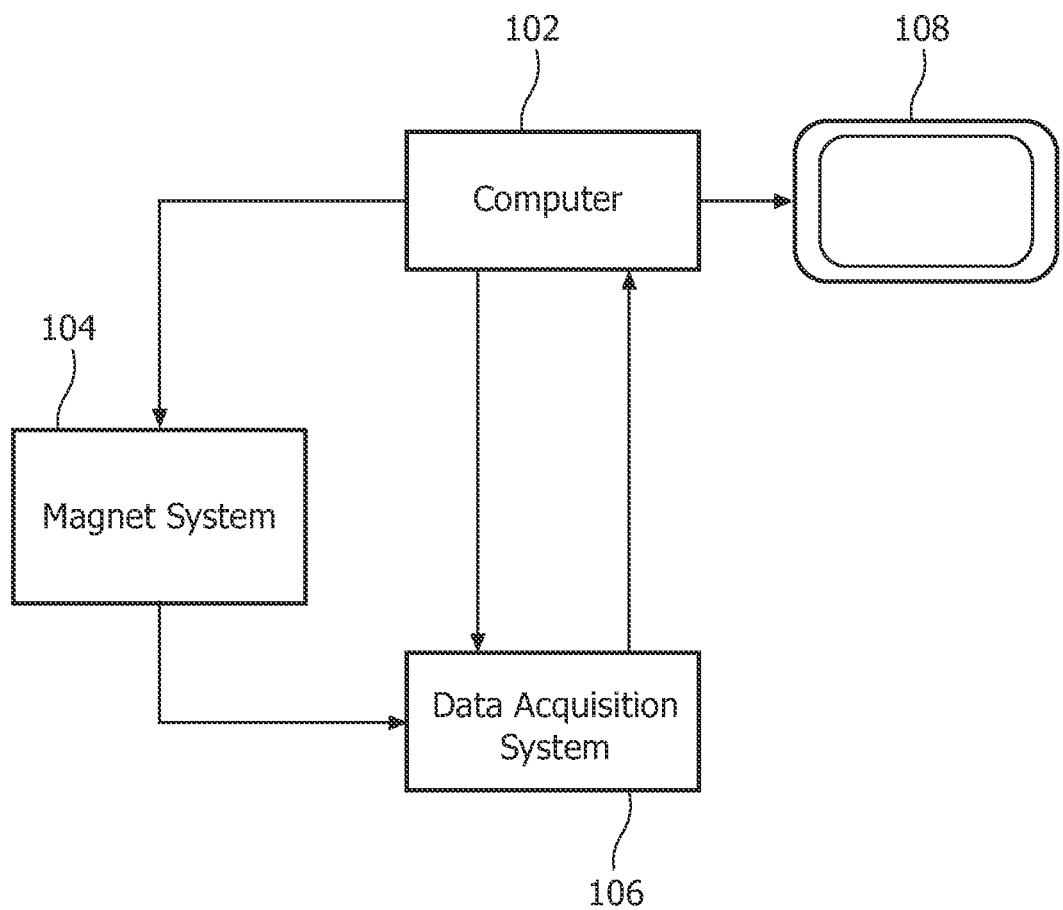
FIG. 1 of the drawings, shows a typical magnetic resonance imaging apparatus of the invention.

Referring to FIG. 1 of the drawings, a typical magnetic resonance imaging apparatus 100 comprises a computer 102, a magnet system 104, a data acquisition system 106, and a display 108. The magnet system 104, data acquisition system 106 and display 108 are well known in the art and will not be described in any further detail herein. In general terms, the computer 102 controls the gradient and RF magnets or coils (not shown) in the magnet system 104 via amplifiers (not shown). The computer also controls the data acquisition system 106, processes the data acquired, and outputs an image to the display 108.

Figure 2:
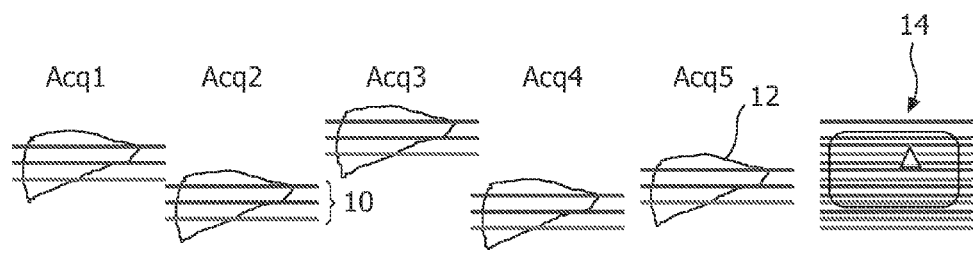
FIG. 2 of the drawings schematically illustrates a 3-slice 5-acquisition scan in accordance with an exemplary.
Figure 5:
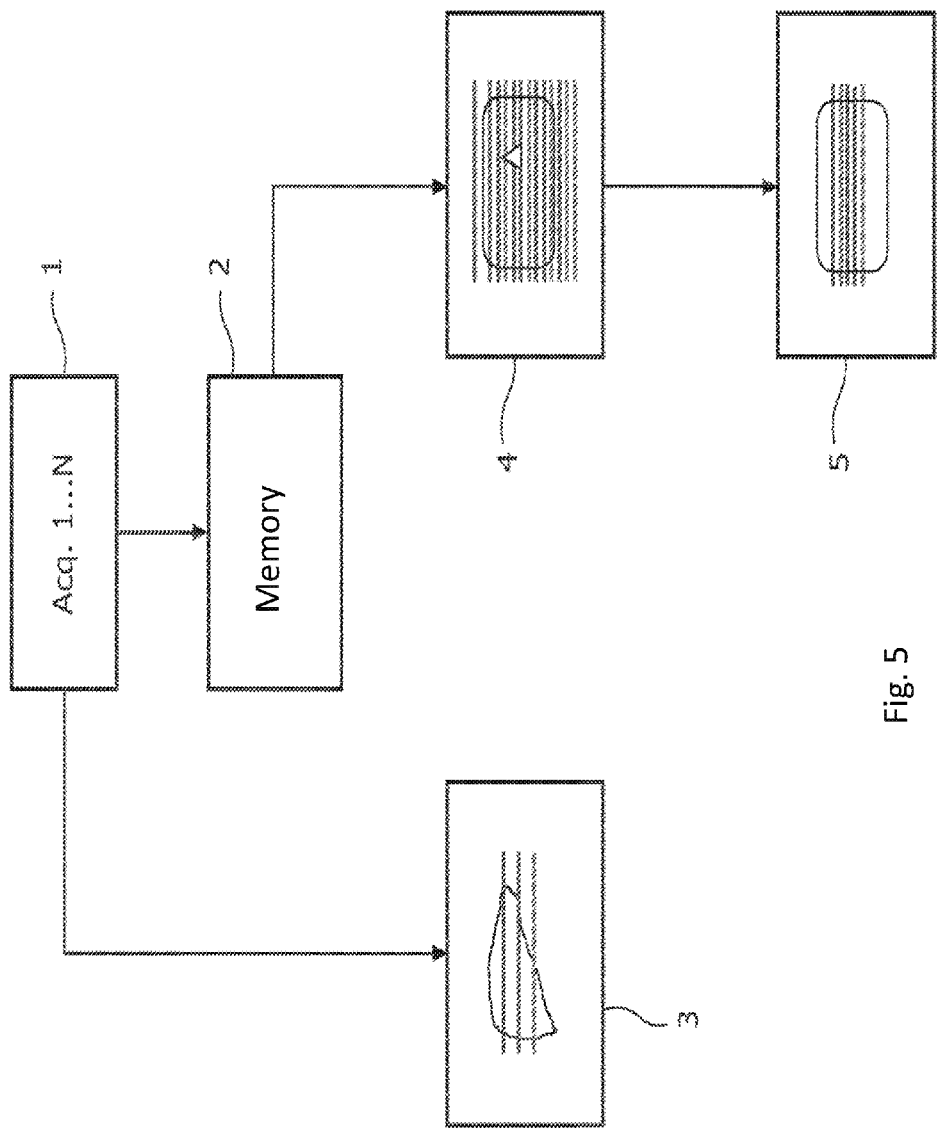
FIG. 5 of the drawings depicts a flow-chart of a method of 3-slice 5-acquisition in accordance with an exemplary embodiment.

Referring now to FIGS. 2 and 5 of the drawings, in accordance with an exemplary embodiment of the invention, a 3-slice 5-acquisition scan is illustrated schematically and a corresponding method flow chart is shown. The scan planes are denoted by reference numeral 10 and the moving object is denoted by reference numeral 12. Thus, for each acquisition, a 3-slice image of the object 12 is measured (step 1). It will be seen that the object 12 moves up and down such that the object location is different for each of the 5 acquisitions. By using a conventional navigator echo technique, the image location is tracked in real time so that the scan planes 10 relative to the object 12 are the same for each acquisition. In contrast, the scan planes relative to a static object in the imaging region will all be in different locations so the actual scan planes will be randomly spread in relation to the static object (this is illustrated schematically in FIG. 1 and denoted by reference numeral 14). Thus, in accordance with this exemplary embodiment of the present invention, data are stored in memory (step 2). The data are representative of the measured motion of the moving object 12 (in this case, for example, diaphragm displacement data) and this stored data can be used later to calculate actual scan plane location for the static object.

Figure 3:
FIG. 3 shows that, the (relatively low SNR) image data from the N (=5 in this case) acquisitions are averaged to provide a single (high SNR) averaged image for each slice

When the scan has finished, the acquired data is reconstructed in a conventional manner. As illustrated schematically in FIG. 3 of the drawings, the (relatively low SNR) image data from the N (=5 in this case) acquisitions are averaged to provide a single (high SNR) averaged image for each slice 10 (step 3). This averaging results in a high image quality in respect of the moving object 12 because for the static object, slice locations change for each acquisition. In FIG. 2, this is illustrated (and denoted by reference numeral 14) for a single slice plane. A typical slice interval is 5 mm for a real clinical application and a range of respiratory motion is 20-30 mm. So a small static structure within the imaging region (such as the triangle 16 illustrated in FIG. 3), which is as small as the slice thickness, will be averaged using image data not containing that structure and, as a result, the small structure will appear blurred in the image and the contrast will be degraded. Thus, by using a conventional navigation echo compensation technique, the final image will be focused on the moving object but out of focus on the static object.

Figure 4:
FIG. 4 illustrates actual scan locations relative to the static object of all scan locations for all acquisitions are densely and randomly distributed.

In accordance with this exemplary embodiment of the invention, therefore, a subsequent "sorted averaging" process is performed with the same image data set. Each acquired image location is calculated by adding the original scan location and measured diaphragm displacement (step 4). As illustrated in FIG. 4 of the drawings, actual scan locations relative to the static object of all scan locations for all acquisitions are densely and randomly distributed, because the location range for each slice (which is the range of diaphragm displacement) is much wider than a slice interval between neighboring slices. If it is required to generate a sharper image for a static object within the imaging region, for example, the triangle 16 illustrated in FIG. 3, image data (from all slices and all acquisitions) can be selected (step 5) from closest to the location of that object and then averaged. In other words, by sorting image data by actual slice position and selecting N (in the illustrated example, 5) slices of image data closest to the target location and then averaging those, a sharper image of the static object can be generated than with the conventional averaging technique). The final image will then be focused on the static object and out of focus on the moving object.

Thus, with the method described above, two image sets can be obtained from a single respiratory navigated image set, one for focusing on the static object and another for focusing on the moving object. The image acquisition process is exactly the same as that for the conventional respiratory navigator echo technique. Therefore, scan time using the method of the invention relative to the conventional respiratory navigator echo technique remains unchanged and the scan failure that can occur during the respiratory triggering technique described above is prevented. On the other hand, it is possible by the method of the invention to obtain sharp images of both static and moving objects within an imaging region from a single set of navigator echo scan image data without any scan time extension relative to the conventional method.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A magnetic resonance imaging apparatus, comprising:
a data acquisition system including means for motion compensation, the data acquisition system being configured to acquire an image data set of a moving object within an imaging region, said image data set comprising a plurality of acquisitions, each acquisition comprising one or more slice planes located at a same relative scan location of said moving object, respectively, throughout said plurality of acquisitions;
means for averaging respective one or more slice planes from said plurality of acquisitions to generate a single, average image set of said moving object;
means for calculating an actual scan location of all of said one or more slice planes from all of said acquisitions with respect to a static object within the imaging region; and
means for averaging a selected set of slice planes, based on said calculation, to generate a single, average image set of the static object.

2. The apparatus according to claim 1, wherein said means for motion compensation comprises navigator echo means.

3. The apparatus according to claim 1, further comprising storage means for storing said image data set and object displacement measured by said means for motion compensation.

4. A magnetic resonance imaging method, the method comprising:
acquiring a motion compensated image data set of a moving object within an imaging region, said motion compensated image data set comprising a plurality of acquisitions and each acquisition comprising one or more slice planes located at a same relative scan location of said moving object, respectively, throughout said plurality of acquisitions;
averaging respective one or more slice planes from said plurality of acquisitions to generate a single, averaged image set of said moving object;
calculating an actual scan location of all of said one or more slice planes from all of said acquisitions with respect to a static object within the imaging region; and
averaging a selected set of slice planes, based on said calculation, to generate a single, averaged image set of the static object.

5. A non-transitory computer readable medium configured to perform the magnetic resonance imaging method of claim 4.

* * * * *